US008863373B2

(12) United States Patent
Matsuoka et al.

(10) Patent No.: US 8,863,373 B2
(45) Date of Patent: Oct. 21, 2014

(54) APPARATUS AND METHOD OF APPLICATION AND DEVELOPMENT

(75) Inventors: Nobuaki Matsuoka, Koshi (JP); Shinichi Hayashi, Koshi (JP); Yasushi Hayashida, Koshi (JP); Yoshitaka Hara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 831 days.

(21) Appl. No.: 12/909,191

(22) Filed: Oct. 21, 2010

(65) Prior Publication Data

US 2011/0032494 A1 Feb. 10, 2011

Related U.S. Application Data

(62) Division of application No. 11/384,323, filed on Mar. 21, 2006, now Pat. No. 7,841,072.

(30) Foreign Application Priority Data

Mar. 23, 2005 (JP) ................................ 2005-084546

(51) Int. Cl.
*B23P 19/00* (2006.01)
*H05K 3/36* (2006.01)
*H05K 3/10* (2006.01)
*H01L 21/67* (2006.01)

(52) U.S. Cl.
CPC ...... *H01L 21/6715* (2013.01); *H01L 21/67225* (2013.01)
USPC .................... 29/742; 29/745; 29/830; 29/846

(58) Field of Classification Search
CPC ............. H01L 21/67225; H01L 21/6715; H01L 2924/01078; H01L 2924/01079; H01R 43/20; H01B 13/18
USPC .......... 29/846, 729, 742, 745, 705, 719, 720, 29/830; 38/145; 382/147, 144, 145, 141; 414/939; 118/52, 56, 319, 320, 500, 118/712, 323, 66
See application file for complete search history.

(56) References Cited

U.S. PATENT DOCUMENTS 5,943,880 A * 8/1999 Tateyama ...................... 62/434
6,261,007 B1 * 7/2001 Takamori et al. ............. 396/611
(Continued)

FOREIGN PATENT DOCUMENTS

JP 01-241840 9/1989
JP 7-288225 10/1995
(Continued)

OTHER PUBLICATIONS

Japanese Office Action issued on Jul. 14, 2009 for Japanese Patent Application No. 2005-084546 with English translation.

*Primary Examiner* — David Angwin
(74) *Attorney, Agent, or Firm* — Smith, Gambrell & Russell LLP (57) ABSTRACT

An application and development apparatus has a plurality of vertically stacked blocks directed to coating film formation on a substrate. This plurality of blocks includes first processing units, a first substrate transportation region, and a first transportation unit for transporting substrates between the first processing units within the first transportation region. A development process block also is vertically stacked with the blocks directed to coating film formation to constitute a layered block as the process block. The development process block also includes second processing units and a second transportation unit for transporting substrates between the second processing units within the second transportation region. The application and development apparatus further has a shelf-type delivery stage group, a vertical transportation unit and a substrate inspection unit such that a substrate input into the inspection unit passes through the delivery stage group from the vertical transportation unit.

6 Claims, 10 Drawing Sheets

(56) References Cited

U.S. PATENT DOCUMENTS

| | | | |
|---|---|---|---|
| 6,264,381 B1 * | 7/2001 | Ueda | 396/604 |
| 6,341,903 B1 * | 1/2002 | Ueda | 396/611 |
| 6,402,400 B1 * | 6/2002 | Ueda et al. | 396/611 |
| 6,471,422 B1 * | 10/2002 | Ueda et al. | 396/611 |
| 6,585,430 B2 * | 7/2003 | Matsuyama et al. | 396/611 |
| 2006/0183340 A1 * | 8/2006 | Hayashida et al. | 438/758 |
| 2007/0004052 A1 * | 1/2007 | Wada et al. | 438/5 |
| 2011/0032494 A1 * | 2/2011 | Matsuoka et al. | 355/27 |

FOREIGN PATENT DOCUMENTS

| | | | |
|---|---|---|---|
| JP | 11-186358 | | 7/1999 |
| JP | 2002-033266 | * | 1/2002 |
| JP | 2004-311714 | | 11/2004 |

* cited by examiner

APPARATUS AND METHOD OF APPLICATION AND DEVELOPMENT

CROSS REFERENCE TO RELATED APPLICATION

This application is a division of Ser. No. 11/384,323, filed Mar. 21, 2006, which is being incorporated in its entirety herein by reference.

BACKGROUND OF THE INVENTION

1. Field of the Invention

The present invention relates to an application and development apparatus carrying out an application process of a resist solution on a substrate such as a semiconductor wafer or LCD substrate (glass substrate for liquid crystal display) and a development process after exposure, and a method thereof.

2. Description of the Background Art

There is known a series of steps as a fabrication process of semiconductor devices and LCD substrates, including the steps of forming a resist film on a substrate, exposing the resist film using a photomask, and then applying a development process to obtain the desired pattern. Such a process is conducted employing a system with an exposure apparatus connected to an application and development apparatus that conducts application of a resist solution and development.

The substrate on which a resist pattern is formed is subjected to predetermined inspection such as inspecting the resist pattern line width, the overlapping level between the resist pattern and underlying pattern, development deficiency, and the like. Only substrates passing the inspections are transferred to the next step. Such inspection of substrates is often carried out by a stand-alone inspection apparatus that is provided independent of the application and development apparatus. It would be convenient to employ the so-called in-line system in which a substrate inspection apparatus is provided in the application and development apparatus.

Figure 12:
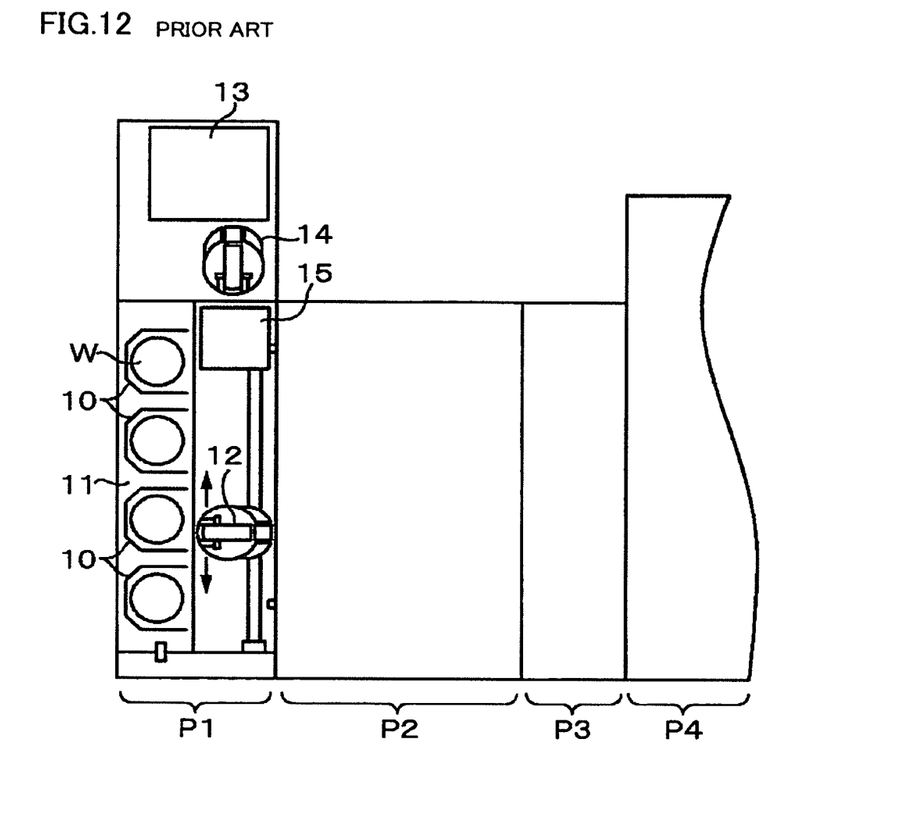
FIG. 12 is a fragmentary plan view of a conventional application and development apparatus.

Japanese Patent Laying-Open No. 2002-033266 discloses an application and development apparatus employing such an in-line system. The apparatus includes a carrier block P1, as well as a process block P2 and an interface block P3 connected at the rear side of carrier block P1, and has an exposure apparatus P4 connected to interface block P3, as shown in FIG. 12. Carrier block P1 includes a carrier stage 11 to which a carrier 10 with a plurality of substrates stored therein is transferred, and a delivery arm 12 that transfers a substrate to/from carrier 10 on carrier stage 11. The substrate in carrier 10 is transported to process block P2 via delivery arm 12 to have a resist film formed thereon. Then, the substrate is transferred into exposure apparatus P4 via interface block P3 to be exposed. The substrate subjected to the exposure process is transferred into process block P2 via interface block P3 to be subjected to a development process. The substrate subjected to the development process is transferred to delivery arm 12.

A substrate inspection unit 13 is provided at the side of carrier block P1. The substrate subjected to the development process is transferred by delivery arm 12 into substrate inspection unit 13 via an intermediate stage 15 and a dedicated arm 14 to undergo the aforementioned predetermined inspection. The substrate subjected to inspection is passed to delivery arm 12 through an opposite route to be returned to carrier 10.

If substrate inspection unit 13 is to be connected to a unit other than carrier block P1 (for example, if substrate inspection unit 13 is provided at interface block P3), transportation will become complicated since the substrate subjected to development will be returned to the interface block P3 side, leading to degradation in transportation efficiency. Further, the space to arrange a buffer cassette to absorb the difference in the processing speed from the exposure apparatus, and/or a temperature adjuster unit to set the temperature of the substrate at high accuracy corresponding to the temperature of the exposure apparatus is insufficient in interface block P3. If the substrate inspection unit is arranged, interface block P3 will be increased in size. Provision of substrate inspection unit 13 at process block P2 is inappropriate from the standpoint of space and transportation route.

Thus, substrate inspection unit 13 is connected to carrier block P1. An advantage of this configuration is that, since a substrate can be delivered into substrate inspection unit 13 from an external source via carrier block P1, substrate inspection unit 13 can be used independently even in the case where the application and development process is inhibited due to maintenance or the like at process block P2.

However, this configuration is disadvantageous in that installation in a clean room induces the problem of poor space efficiency since inspection unit 13 will protrude laterally when connected at the side of carrier block P1. The configuration is disadvantageous from the standpoint of arranging peripheral equipment and ensuring space for maintenance. Particularly in the case where a large-sized substrate such as a semiconductor wafer identified as a substrate (referred to as "wafer" hereinafter) that becomes as large as 12 inches or more is involved, the structure in plane of substrate inspection unit 13 will expand to result in a larger protruding area in the lateral direction, which is ever more undesirable.

SUMMARY OF THE INVENTION

In view of the foregoing, an object of the present invention is to provide an application and development apparatus that allows a configuration that is not disadvantageous from the standpoint of installation space when a substrate inspection unit is to be incorporated.

Another object of the present invention is to provide an application and development method directed to improving the throughput in view of the operation of an application and development apparatus as well as inspection of processed substrates.

An application and development apparatus of the present invention is configured to deliver a substrate input by a carrier into a carrier block to a process block via a transportation unit for use in the carrier block, form a coating film including a resist film at the substrate in the process block, transport the substrate to an exposure apparatus via an interface block, apply a development process in the process block to a substrate subjected to exposure and returned to the process block via the interface block, and deliver the substrate subjected to development to the carrier block.

The application and development apparatus includes a plurality of blocks stacked on each other and directed to coating film formation. Each of the blocks directed to coating film formation includes a plurality of first processing units having a first solution processing unit to apply a coating solution on a substrate and a first heating unit to heat the substrate applied with a coating film, and a transportation unit for use in a first block to transport a substrate between the first processing units. At least one of the plurality of blocks directed to coating film formation includes a solution processing unit for applying a resist solution.

The application and development apparatus further includes a development process block stacked with respect to the blocks directed to coating film formation to constitute a layered block together with the blocks directed to coating film formation.

The development process block includes a plurality of second processing units having a second heating unit to heat an exposed substrate and a second solution processing unit to apply a developer on the substrate, and a transportation unit for use in a second block to transport a substrate between the second processing units.

The application and development apparatus further includes a shelf-type delivery stage group having a plurality of delivery stages between the carrier block and the layered block. A delivery stage is arranged for each of the plurality of blocks directed to coating film formation and the development process block to deliver a substrate with respect to the transportation unit for use in the first block or the transportation unit for use in the second block.

The application and development apparatus further includes a vertical transportation unit to ascend and descend among the delivery stages of the delivery stage group to deliver a substrate, and a substrate inspection unit at an upper portion of the carrier block, and located higher than the transportation unit for use in the carrier block.

The application and development apparatus has a substrate input to the substrate inspection unit via the vertical transportation unit.

According to a specific manner of the present invention, the application and development apparatus further includes an auxiliary transportation unit dedicated to the substrate inspection unit to deliver a substrate with respect to the substrate inspection unit. The delivery stage group includes an inspection port delivery stage where a substrate is delivered by the auxiliary transportation unit. A substrate is input into the substrate inspection unit from the vertical transportation unit via the delivery stage and auxiliary transportation unit.

The auxiliary transportation unit is provided at an upper portion of the carrier block, for example, and is located higher than the transportation unit for use in the carrier block. The delivery stage where a substrate is delivered by the auxiliary transportation unit for the substrate inspection unit is provided in the delivery stage group. As used herein, "provided in the delivery stage group" includes an arrangement not only between each stage of the delivery stage group, but also at the topmost or bottom-most portion of the delivery stage group.

According to another manner of the present invention, delivery of a substrate between the vertical transportation unit and the substrate inspection unit is conducted without intervention of the delivery stage group. In this case, an auxiliary transportation unit dedicated to the substrate inspection unit is provided by which a substrate is transported into a stage in the substrate inspection unit through the vertical transportation unit.

According to a more specific example of the present invention, the carrier block includes a filter unit that supplies cleaning gas in down flow to a substrate transportation region. The substrate inspection unit is provided upper than the filter unit.

According to another aspect of the present invention, the substrate inspection unit is arranged at a location different from that set forth above. The substrate inspection unit is provided in the shelf-type delivery stage group. "In the shelf-type delivery stage group" includes the location between the delivery stages arranged vertically in the delivery stage group, the topmost stage, and the bottom-most stage of the shelves in the delivery stage group.

The plurality of blocks directed to coating film formation stacked on each other include a block to apply a resist solution to a substrate, a block to apply a chemical solution for an anti-reflective film to the substrate prior to applying a resist solution, and a block to apply a chemical solution for the anti-reflective film to the substrate after application of a resist solution. Also, the delivery stage group, for example, includes a carrier block delivery stage to deliver a substrate between the carrier block and the process block.

According to a further aspect of the present invention, the vertical transportation unit in accordance with the invention set forth above is arranged at either the left side or right side of the delivery stage group when viewed from the carrier block side. The substrate inspection unit is provided at the side of the delivery stage group opposite to the side where the vertical transportation unit is located. A substrate is input from the vertical transportation unit into the substrate inspection unit, passing through the interior of the delivery stage group. In accordance with a specific manner of the present invention, an auxiliary transportation unit dedicated to the substrate inspection unit is provided between the delivery stage group and substrate inspection unit. A substrate placed on a delivery stage in the delivery stage group is input into the substrate inspection unit via the auxiliary transportation unit. This substrate may be delivered directly to the auxiliary transportation unit from the vertical transportation unit.

An application and development method of the present invention is directed to effecting an application and development process using an application and development apparatus set forth above.

The application and development method includes the steps of: delivering a substrate input to a carrier block by a carrier to a delivery stage in the delivery stage group via the transportation unit for use in the carrier block; delivering the substrate on the delivery stage to the transportation unit for use in the first block in the block directed to coating film formation, and then forming a coating film including a resist film on the substrate in the block directed to coating film formation; following the resist film formation step, transporting the substrate to the exposure apparatus via the interface block, and transporting the substrate exposed by the exposure apparatus to the development process block via the interface block; applying a development process on the substrate in the development process block; transporting via the vertical transportation unit the substrate subjected to the coating film formation process or development process into the substrate inspection unit provided at an upper portion of the carrier block, and located higher than the transportation unit for use in the carrier block; and conducting inspection on the substrate in the substrate inspection unit.

In the present invention, the step of transporting the substrate subjected to a coating film formation process or development process into the substrate inspection unit via the vertical transportation unit can include the steps of delivering the substrate by the vertical transportation unit to a delivery stage constituting the substrate inspection port in the delivery stage group, and transporting the substrate on the delivery stage into the substrate inspection unit via an auxiliary transportation unit dedicated to the substrate inspection unit, or delivering the substrate from the vertical transportation unit to the substrate inspection unit without intervention of the delivery stage group.

In the present invention, "delivering the substrate on the delivery stage to the transportation unit in the block directed to coating film formation" includes the case where the transportation unit for use in the carrier block delivers the substrate onto one delivery stage and then delivering that substrate to another delivery stage by the vertical transportation unit, and then transporting the substrate on the another delivery stage to the transportation unit for use in the block. In the application and development method, the substrate inspection unit may be provided in the shelf-type delivery stage group.

In the method of the present invention, the vertical transportation unit can be provided at either the left side or right side of the delivery stage group when viewed from the carrier block side, and the substrate inspection unit can be provided at the side of the delivery stage group opposite to the side where the vertical transportation unit is located, allowing the substrate to be input from the vertical transportation unit into the substrate inspection unit, passing through the interior of the delivery stage group.

In the present invention, a plurality of blocks are layered, divided into blocks for coating film formation and blocks for a development process, and delivery stages to deliver a substrate with respect to a transportation unit for use in the first block (or the second block) are provided for respective blocks at the carrier block side to constitute a shelf-type delivery stage group. A vertical transportation unit transporting a substrate between the delivery stages of the delivery stage group is also provided. The substrate inspection unit is arranged at an empty space at an upper portion of the carrier block. A substrate is transported to the substrate inspection unit via the vertical transportation unit (including the case of direct transportation by the vertical transportation unit, and transportation from the vertical transportation unit via a delivery stage identified as the inspection port in the delivery stage group).

By virtue of the present invention, the substrate inspection unit can be placed at an upper empty space in the carrier block. Accordingly, the disadvantageous layout of the substrate inspection unit being located laterally outside the main unit of the application and development apparatus is eliminated, allowing an appropriate layout to obviate an unfavorable configuration from the standpoint of installation space. The present invention is also advantageous from the standpoint of transportation configuration. That is, since a substrate is transported to the substrate inspection unit employing a vertical transportation unit that effects transportation between the block directed to coating film formation and development process block, a transportation mechanism with a large stroke in the vertical direction or the need to increase the vertical stroke of the transportation unit for use in the carrier block, caused by the arrangement of the substrate inspection unit at a high position, can be eliminated.

According to another aspect of the present invention, the substrate inspection unit is provided in the delivery stage group, and a substrate is delivered between the delivery stage group and the substrate inspection unit through the vertical transportation unit. In comparison between the height of one block among the blocks directed to coating film formation and development process and the height of the delivery stage, there is an empty space in the vertical direction for the shelves constituting the delivery stage group. By arranging the substrate inspection unit utilizing this empty space as in the foregoing, an appropriate layout similar to that set forth above can be realized to obviate an unfavorable configuration from the standpoint of installation space.

According to a further aspect of the present invention, an appropriate layout similar to that set forth above can be realized to obviate an unfavorable configuration from the standpoint of installation space since the substrate inspection unit is arranged in the empty space at the side of the delivery stage group opposite to the side where the vertical transportation unit is located.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of an application and development apparatus of the present invention will be described hereinafter.

Figure 1:
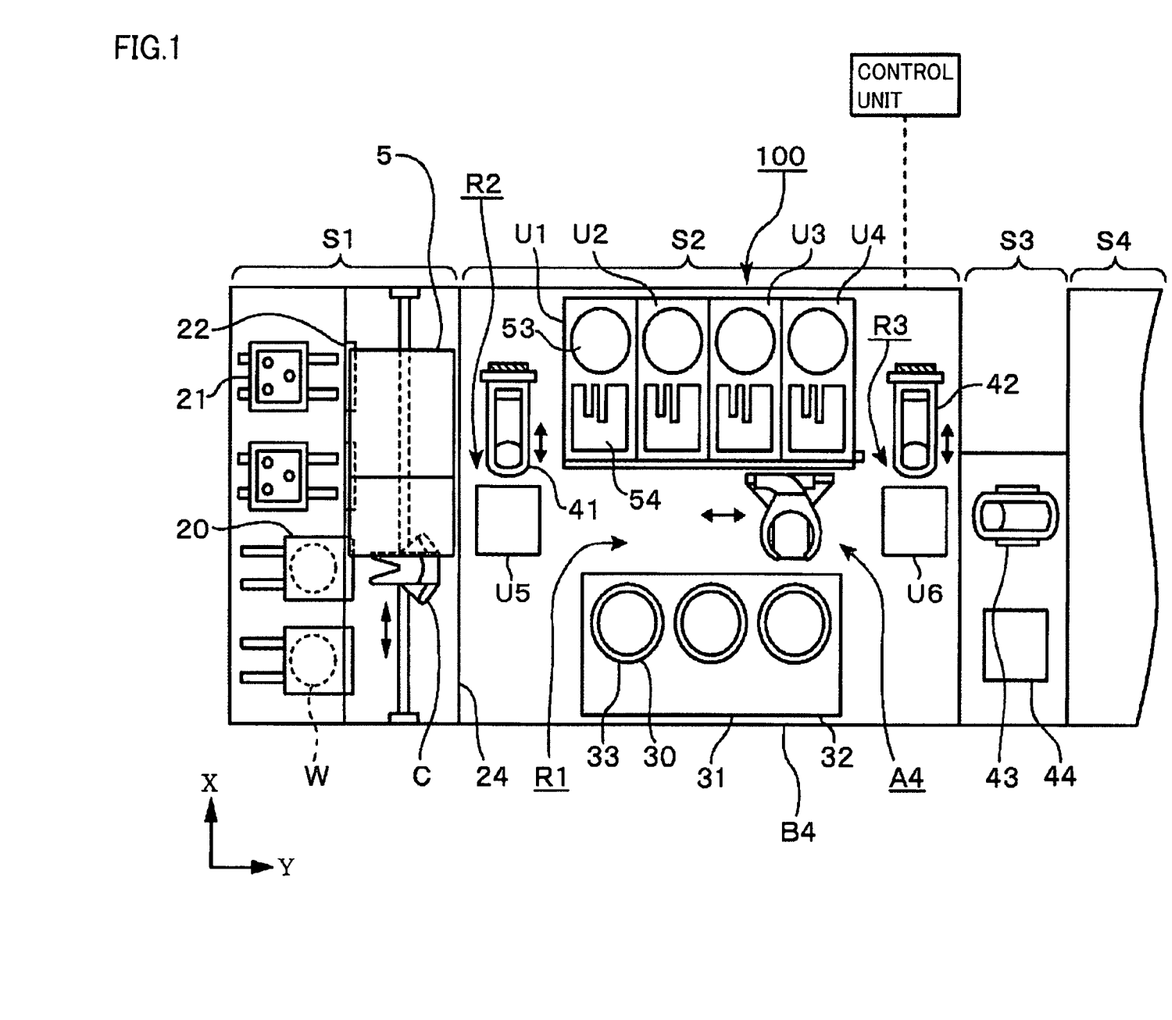
FIG. 1 is a plan view of an embodiment of an application and development apparatus of the present invention.
Figure 2:
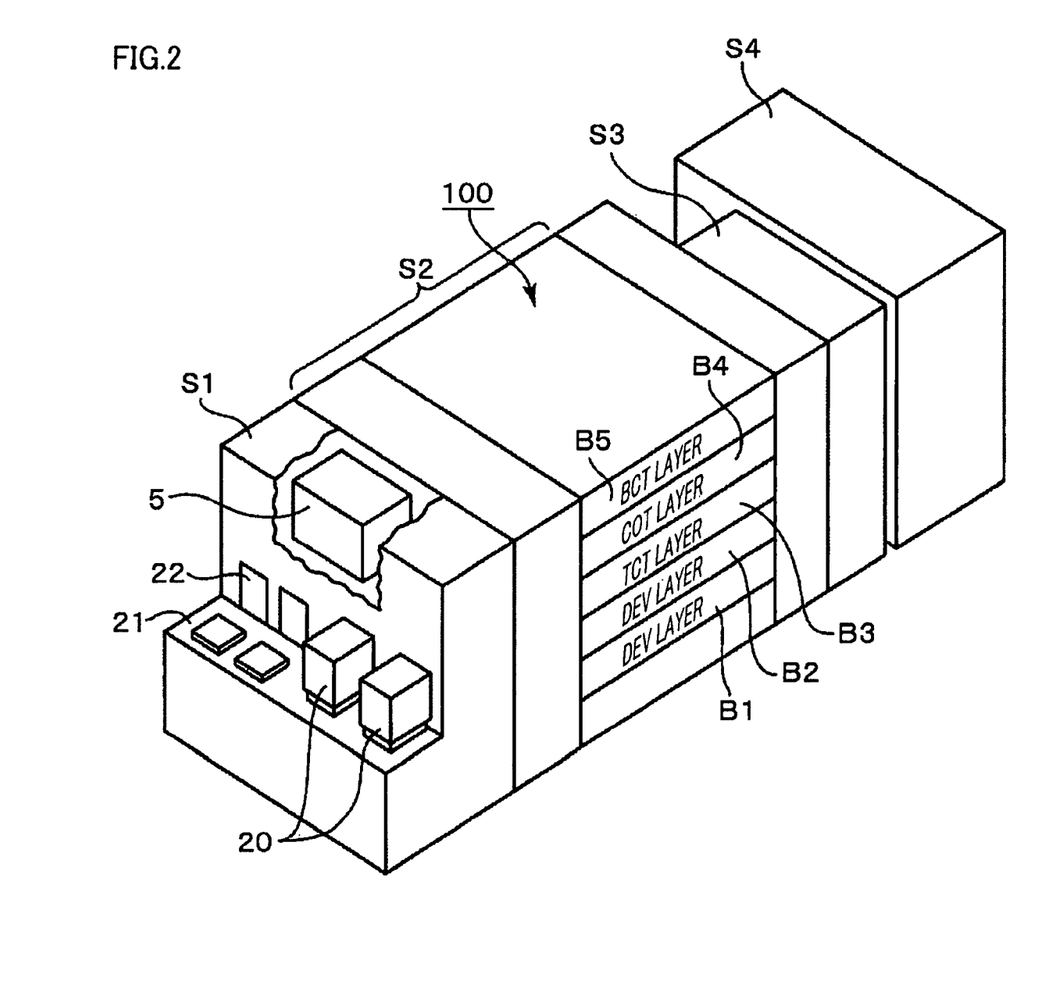
FIG. 2 is a perspective view of the application and development apparatus of FIG. 1.
Figure 3:
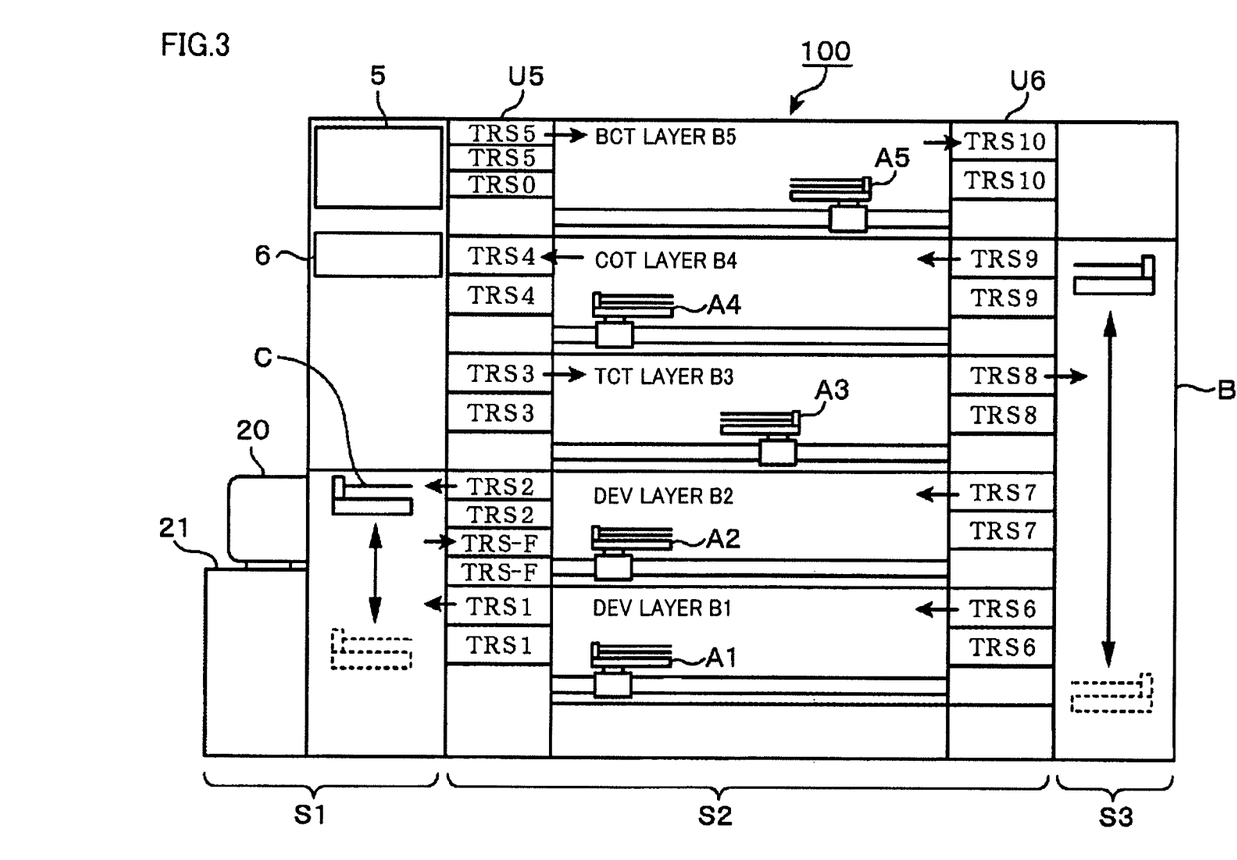
FIG. 3 is a side sectional view of the application and development apparatus of FIG. 1.

Referring to FIGS. 1, 2 and 3, an application and development apparatus according to an embodiment of the present invention includes a carrier block S1 to input/output a carrier 20 in which thirteen, for example, wafers W identified as substrates are stored in a sealed manner, a process block S2 formed of a layered block 100 having a plurality of, for example five, blocks B1-B5 arranged vertically, an interface block S3, and an exposure apparatus S4.

In carrier block S1 are provided a mount 21 on which a plurality of carriers 20 can be mounted, a door 22 provided at the front wall when view from mount 21, and a transfer arm C identified as a transportation mechanism for the carrier block to take out a wafer W from carrier 20 via door 22. Transfer arm C is formed so as to move forward and backward, up and down, rotate about a vertical axis, and move in the aligned direction of carriers 20 to deliver wafer W with respect to delivery stages TRS1, TRS2, and TRS3 of block B2 that will be described afterwards.

A process block S2 housed in a casing 24 is connected at the rear side of carrier block S2. Layered block 100 provided at process block S2 includes, in the present embodiment, first and second blocks (DEV layer) B1 and B2 corresponding to the two bottom stages for a development process, a third block (TCT layer) B3 for formation of an anti-reflective film (hereinafter, referred to as "second anti-reflective film") formed at the upper layer side of a resist film, a fourth block (COT layer) B4 for an application process of a resist solution, and a fifth block (BCT layer) B5 for formation of an anti-reflective film (hereinafter, referred to as "first anti-reflective film") formed at the lower layer side of the resist film. DEV layers B1 and B2 correspond to blocks for a development process. TCT layer B3, COT layer B4, and BCT layer B5 correspond to blocks for coating film formation.

The structure of first to fifth blocks B (B1-B5) will be described hereinafter. Each of blocks B1-B5 includes a solution processing unit to apply a chemical solution on wafer W, and a processing unit of various heating and cooling systems for a pretreatment and post-treatment with respect to the process carried out at the solution processing unit. Blocks B1-B5 also include main arms A1-A5, respectively, each qualified as a dedicated transportation unit A to deliver a wafer between the solution processing unit and the heating/cooling system processing unit.

First, an example of COT layer B4 of FIG. 1 will be described hereinafter. Substantially at the center of COT layer B4, a wafer transportation region R1 of a wafer W is provided in the longitudinal direction of COT layer B4 (in the direction of the Y axis in FIG. 1) to establish connection with carrier block S1 and interface block S3. At the right side of transportation region R1 viewed from the carrier block S1 side, an application unit 31, identified as a solution processing unit, is provided. Application unit 31 includes a housing 32 in which several (for example 3) applicators 30 to effect a resist application process are arranged. Applicator 30 includes a wafer holder that holds and rotates a wafer, and a cup 33 encasing the wafer holder. Applicator 30 is configured to supply a resist solution from a nozzle towards the center of a wafer and rotate the wafer holder to spread the resist solution.

Figure 4:
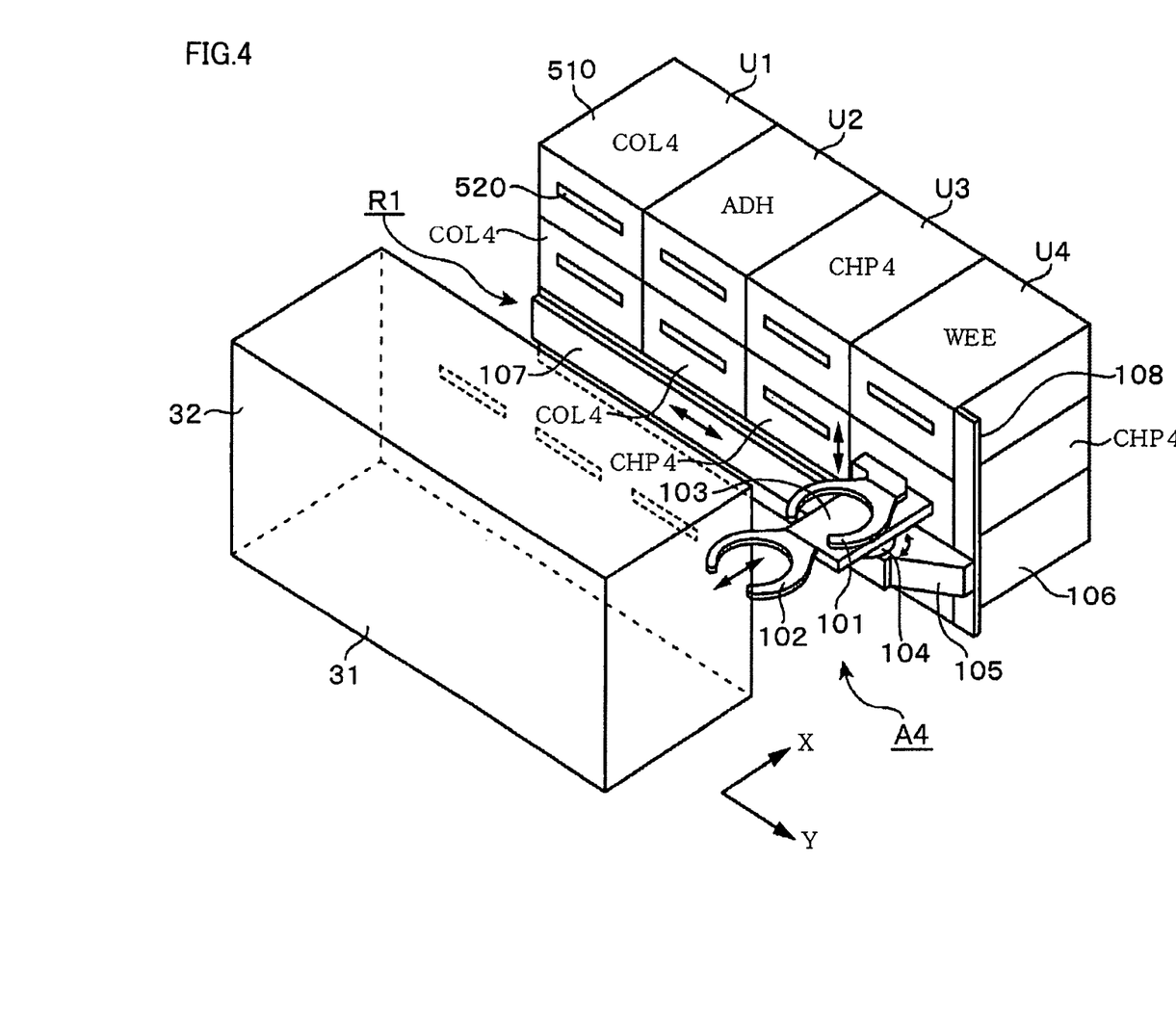
FIG. 4 is a schematic perspective view of a portion of the application and development apparatus of FIG. 1 to describe the position relationship between the dedicated transportation unit in the substrate inspection unit and the shelf-type delivery stage group.

At the left side of transportation region R1 viewed from the carrier block S1 side, four shelf units U1, U2, U3 and U4 corresponding to a multistage of heating/cooling system units are sequentially provided. Shelf units U1, U2, U3 and U4 are configured having various units for the pretreatment and post-treatment carried out at application unit 31, stacked in a plurality of stages (for example, two stages). The various units for the aforementioned post-treatment and pretreatment include, for example, a cooling unit (COL4) to adjust wafer W to a predetermined temperature prior to application of a resist solution, a heating unit (CHP4) called a prebaking unit, for example, to heat wafer W after application of a resist solution, a hydrophobic processing unit (ADH) to improve the adherence between the resist solution and wafer W, a perimeter exposure apparatus (WEE) to selectively expose only the edge region of wafer W, and the like, as shown in FIG. 4. The processing units such as the cooling unit (COL4) and heating unit (CHP4) are each accommodated in a processing vessel 510. Shelf units U1-U4 have two stages of processing vessels 510 stacked. A wafer input/output opening 520 is formed at the wall of processing vessel 510 facing transportation region R1. The hydrophobic processing unit is directed to a gas process in an HMDS atmosphere, and is to be provided at any of coating film formation blocks B3-B5.

A main arm A4 identified as the transportation unit for use in a block is provided at transportation region R1. Main arm A4 is configured to deliver a wafer located at respective modules in COT layer B4 (the site where a wafer W is placed such as shelf units U1-U4 and application unit 31) and each of shelf units U5 and U6 that will be described afterwards. Each of main arms A1-A5 includes two arms 101 and 102 to support the back side perimeter region of wafer W, as shown in FIG. 4. Arms 101 and 102 are configured to move forward and backward independent of each other along a base 103. Base 103 is configured to rotate about a vertical axis by means of a rotary mechanism 104 and to move in the Y axis direction along a Y axis rail 107 as well as ascend/descend along a vertical rail 108 by means of a transfer mechanism 105. Y axis rail 107 is attached to the surface of a base 106 that supports shelf units 101-104, facing transportation region R1. Thus, arms 101 and 102 are configured to move forward and backward, slide in the Y axis direction, ascend and descend, and rotate about a vertical axis to allow delivery of wafer W among each of shelf units U1-U6, first and second delivery stages including TRS1-TRS10, and the solution processing unit.

The area of transportation region R1 adjacent to carrier block S1 is defined as a first wafer delivery region R2. At this region R2 are provided a shelf unit U5 at a site achieving access with transfer arm C and main arm A4, and also a first delivery arm 41 identified as the first vertical transportation unit to deliver wafer W with respect to shelf unit U5.

Shelf unit U5 is configured to deliver wafer W through main arms A1-A5 of blocks B1-B5, respectively, as shown in FIG. 3. In the example of FIG. 3, shelf unit U5 includes first delivery stages TRS1-TRS5 corresponding to blocks B1-B5, respectively. Each first delivery stage is formed of at least one set of shelves (for example, two sets). Shelf unit U5 constitutes the first delivery stage group having multiple first delivery stages stacked. First delivery arm 41 is configured to move forward and backward, and also up and down to allow delivery of a wafer W with respect to each of the first delivery stages TRS1-TRS5.

The application and development apparatus includes a substrate inspection unit 5 at the upper portion of carrier block S1. A delivery stage TRS0 identified as a transportation port (inspection port) of substrate inspection unit 5 is provided in shelf unit U5 identified as the delivery stage group. The configuration in association with substrate inspection unit 5 will be described in detail hereinafter. A filter unit 6 is provided in carrier block S1 above transfer arm C. Filter unit 6 introduces externally applied gas such as air or inert gas to remove particles by the inner filter layer to form a downward stream called down flow in order to clean the transportation region.

Figure 5:
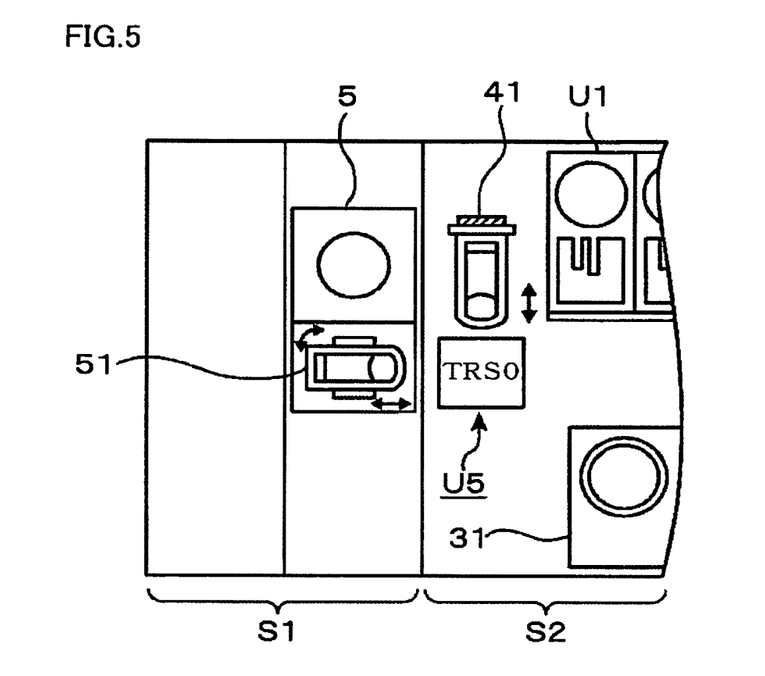
FIG. 5 is a partial fragmentary vertical sectional view of an example of a substrate inspection unit.

Substrate inspection unit 5 is located above filter unit 6, as shown in FIG. 3. Also, an auxiliary arm 51 identified as a dedicated auxiliary transportation mechanism to input/output a wafer to/from substrate inspection unit 5 is provided adjacent to substrate inspection unit 5 in the X direction, as shown in FIG. 5. Delivery stage TRS0 identified as the inspection port is disposed at a height corresponding to BCT layer B5. Auxiliary arm 51 is configured to rotate about the vertical axis, move forward and backward, and slightly up and down, and is located at a position allowing delivery of wafer W between a stage of substrate inspection unit 5 that will be described afterwards and delivery stage TRS0. Although only one stage of delivery stage TRS0 is depicted due to the limitation in illustration, a plurality of stages, for example two stages, is preferable in practice to improve the throughput.

Figure 6:
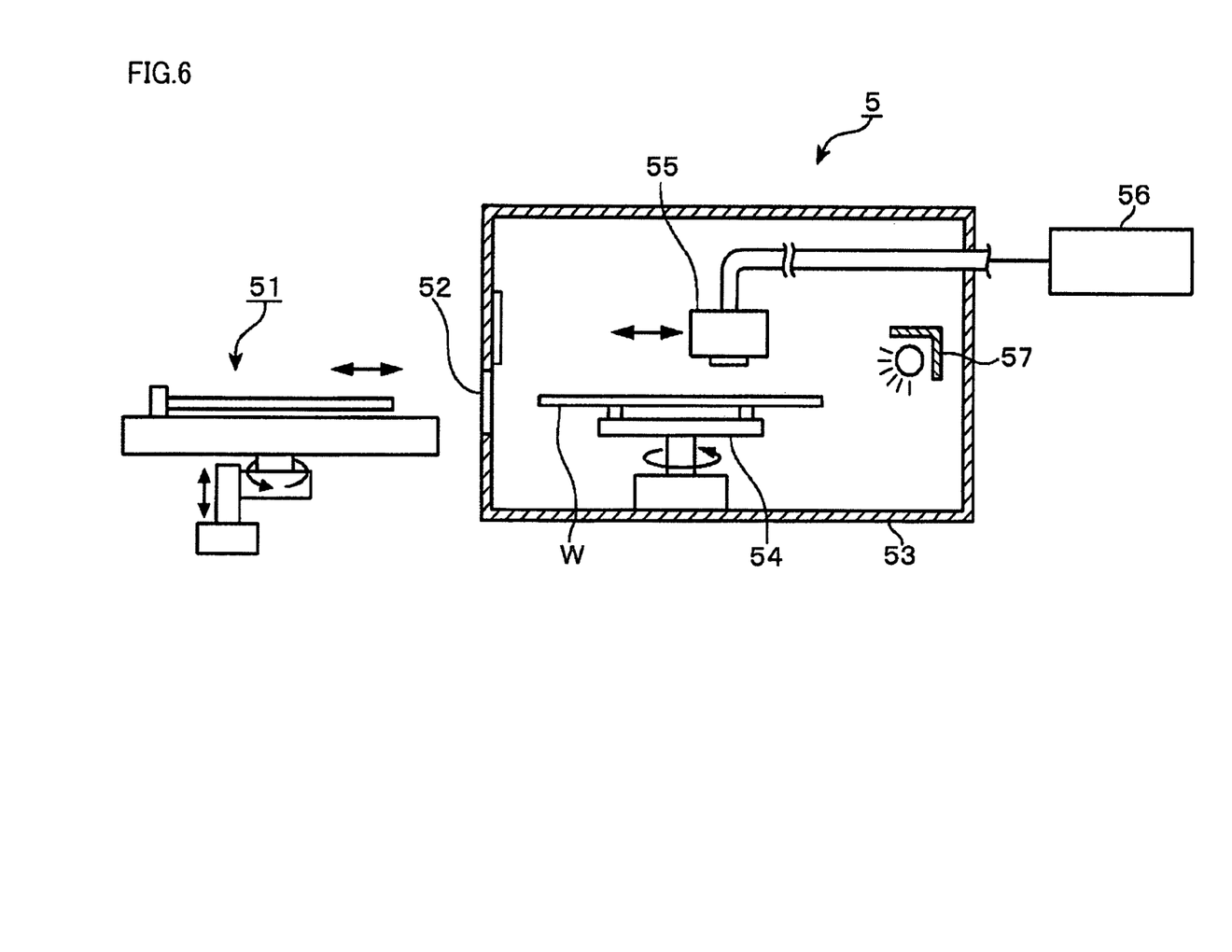
FIG. 6 is a perspective view of an application unit, a shelf unit, and a transportation unit of the application and development apparatus of FIG. 1.

Substrate inspection unit 5 includes a casing 53 with an opening 52 to input/output wafer W, as shown in FIG. 6, for example, a rotation mount 54 formed in casing 53 to hold wafer W horizontally and adjust its orientation, an image pickup unit such as a CCD camera 55, movable in the X, Y and Z directions to take an image of the surface of wafer W on rotation mount 54, and a data processing unit 56 to process the image of wafer W obtained through CCD camera 55. A light 57 is provided in casing 53.

Inspection based on an image of wafer W includes many types such as defocus inspection to detect position displacement of a pattern caused by the exposure apparatus, a development defect detection to detect a defect in the development process, a common defect detection to detect a common defect appearing at the same place and in the same manner at the surface of wafer W, scum detection to detect any resist residue remaining at wafer W after the development process, a "NO RESIST, NO DEVELOP" inspection to detect an unsatisfactory region not undergoing the resist application process and/or development process (unsatisfactory detection), a line width measurement to measure the line width of the resist film formed on wafer W, registration inspection to compare the overlay accuracy between wafer W and the photomask exposed by the exposure apparatus for inspection, and the like.

A film thickness inspection to inspect the thickness of the coating film formed on wafer W can also be conducted by substrate inspection unit 5. In this case, a film thickness sensor to obtain the spectrum of light reflected from wafer W is to be attached at the side of CCD camera 55. Substrate inspection unit 5 may also allow detection of the number of particles attached to wafer W, detection of comets generated by voids and foreign matters in the resist solution on the surface of wafer W after resist application, detection of splash back caused by the resist solution spattered out from the surface of wafer W to adhere to wafer W again, detection of unevenness in the applied resist solution, and the like. It will be understood that the inspection items carried out by substrate inspection unit 5 include, but are not limited to those set forth above, and at least one of the inspection items may be carried out.

The defocus inspection is directed to detecting defocus of the exposure apparatus by comparison with a proper pattern that is registered in advance. Line width measurement is directed to detecting whether the exposure amount and exposure time of the exposure apparatus are appropriate or not by comparison with, for example, a proper pattern registered in advance. The overlay inspection is directed to detecting position displacement of the exposure position of the exposure apparatus by comparing the pattern of a specified site set to allow comparison with an underlying pattern with a proper pattern that is registered in advance.

First delivery stages TRS1 and TRS2 of first and second blocks B1 and B2 are configured to allow delivery of wafer W with respect to transfer arm C in the example of FIG. 3, and corresponds to a delivery stage for the carrier block. In the present example, second block B2 includes, for example, two TRS-Fs as the first delivery stage. Delivery stage TRS-F is employed as a dedicated delivery stage to input wafer W into process block S2 by transfer arm C. Delivery stage TRS-F corresponds to a delivery stage for the carrier block. Delivery stage TRS-F may be provided at first block B 1. Alternatively, wafer W can be input to process block S2 from transfer arm C by means of delivery stages TRS1 and 2, absent of delivery stage TRS-F.

As shown in FIG. 1, the area of transportation region R1 adjacent to interface block S3 is defined as a second wafer delivery region R3. At this region R3 are provided a shelf unit U6 located to achieve access to main arm A4, and a second delivery arm 42 functioning as the second vertical transportation unit to deliver wafer W with respect to shelf unit U6, as shown in FIG. 3.

Figure 7:
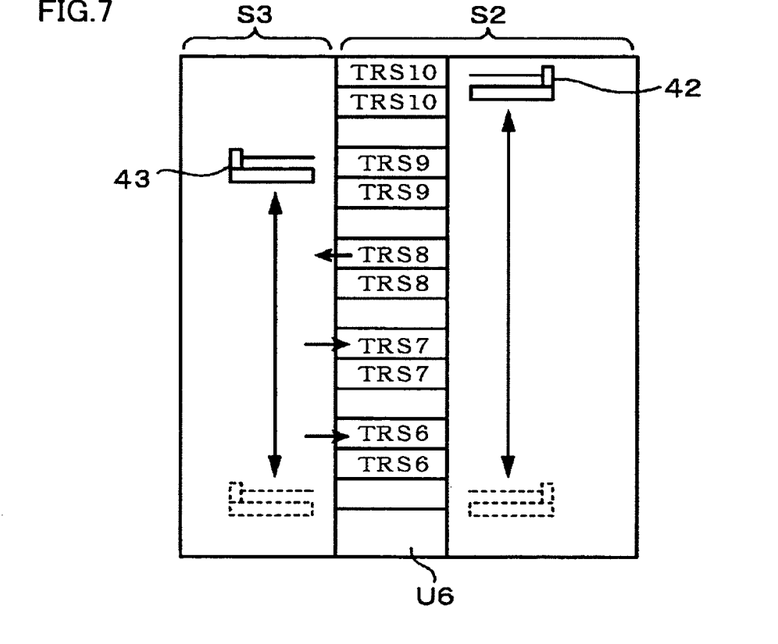
FIG. 7 is a side sectional view of an interface block of the application and development apparatus of FIG. 1.

Shelf unit U6 delivers wafer W with respect to main arms A1-A5 of blocks B1-B5, respectively, as shown in FIGS. 3 and 7. In the example of FIGS. 3 and 7, shelf unit U6 includes second delivery stages TRS6-TRS10 corresponding to blocks B1-B5, respectively. Each second delivery stage is formed of at least one set of shelves (for example, two sets). Shelf unit U6 constitutes the second delivery stage group having multiple second delivery stages stacked. Second delivery arm 42 is configured to move forward and backward, and also up and down to allow delivery of a wafer W with respect to each of second delivery stages TRS6-TRS10. The present embodiment is configured to deliver wafer W arbitrarily between each of blocks B1-B5 stacked up in 5 stages by first delivery arm 41 and second delivery arm 42 via first delivery stages TRS1-TRS5 and TRS-F, and second delivery stages TRS6-TRS10, respectively.

Description will be provided for the other blocks. TCT layer B3 and BCT layer B5 have a configuration substantially similar to that of COT layer B4, with the exception that the chemical solution in the solution processing unit is a chemical solution for an anti-reflective film instead of a resist solution. TCT layer B3 and BCT layer B5 are provided with a main arm A3 (A5) for transporting a wafer W among the heating unit, cooling unit, and various units.

DEV layers B1 and B2 are configured in a manner similar to that of blocks B3-B5. A development unit directed to a development process on wafer W is provided as the solution processing unit. Shelf units U1-U4 include a heating unit (PEB) to carry out a heating process on an exposed substrate, referred to as a post exposure baking unit to heat a wafer W after exposure, a cooling unit (COL) to adjust the temperature of wafer W to a predetermined temperature subsequent to the process of the heating unit (PEB), and a heating unit (POST) referred to as a post baking unit that is directed to a heating process to vaporize moisture from wafer W after the development process. Blocks B1 and B2 have a configuration similar to that of COT layer B4 with the exception set forth above. The development unit is directed to holding the wafer through the wafer holder encased in a cup, supplying a developer from a nozzle for development, cleaning the wafer surface with a cleaning solution, and drying the wafer by rotation through the wafer holder. The configuration thereof is substantially similar to that of the application unit of FIG. 1.

DEV layers B1 and B2 are configured to deliver wafer W using main arms A1, A2, respectively, with respect to first delivery stages TRS1, TRS2, and TRS-F, second delivery stages TRS6 and TRS7, the development unit, and each of shelf units U1-U4.

Exposure apparatus S4 is connected at the rear side of shelf unit U6 in process block S2 with interface block S3 therebetween. Interface block S3 includes an interface arm 43 to deliver wafer W with respect to shelf unit U6 in process block S2 and exposure apparatus S4, and a cooling unit 44 to cool wafer W. Cooling unit 44 is directed to adjusting the temperature of wafer W to the temperature in exposure apparatus S4 at high accuracy. Cooling unit 44 may be provided in shelf unit U6.

Interface arm 43 functions as a wafer W transportation unit (transportation unit for use in the interface block) intervening among process block S2, exposure apparatus S4, and cooling unit 44. In the example of FIG. 7, interface arm 43 is configured to move forward and backward, up and down, and rotate about a vertical axis to allow delivery of wafer W with respect to second delivery stages TRS6-TRS9 of first-fourth blocks B1-B4, respectively. Interface arm 43 may be configured to allow delivery of wafer W with respect to all second delivery stages TRS6-TRS10 of blocks B1-B5.

A function of the present embodiment will be described hereinafter. The present apparatus allows any of the processes of forming an anti-reflective film above and below the resist film, forming an anti-reflective film only at either above or below the resist film, or forming a resist film using the COT layer (block B4) alone without forming an anti-reflective film. For the sake of simplifying the description, an example of forming a resist film using the COT layer (block B4) alone, and effecting a development process employing the DEV layer identified as block B1 will be described. First, a carrier 20 is input from an external source into carrier block 21. Wafer W is taken out from carrier 20 by means of transfer arm C. Wafer W is delivered from transfer arm C to first delivery stage TRS-F of shelf unit U5, to first delivery stage TRS4 by first delivery arm 41, and then to main arm A4 of COT layer B4. At COT layer B4, wafer W is transferred by main arm A4 in the order of hydrophobic processing unit (ADH)→cooling unit COL4→COT (application unit 31)→heating unit CHP4→perimeter exposure apparatus (WEE)→delivery stage TRS9 of shelf unit U6. Thus, a chemical amplified resist film is formed on wafer W.

Wafer W at delivery stage TRS9 is transferred by interface arm 43 to transportation stage 45 of exposure apparatus S4 via cooling unit 44 (COL). Then, wafer W is subjected to an exposure process by exposure apparatus S4. Wafer W subjected to the exposure process is transferred to transportation stage 46, and then to delivery stage TRS6 of DEV layer B1 by interface arm 43. Wafer W on stage TRS6 is received by main arm A1 of DEV layer B1, and transferred in the order of heating unit (PEB1)→cooling unit COL→development unit (DEV)→heating unit (POST)→COL→delivery stage TRS1. Thus, wafer W is subjected to a predetermined development process.

Wafer W subjected to a development process is transferred from delivery stage TRS1 to delivery stage TRS0 (refer to FIGS. 3 and 5) identified as an inspection port in shelf unit U5 (delivery stage group) by first delivery arm 41 identified as the vertical transportation unit. Then, wafer W is transferred to rotation mount 54 in substrate inspection unit 5 by auxiliary arm 51 identified as the dedicated arm of substrate inspection unit 5. Wafer W is then rotated by rotation mount 54 and scanned by CCD camera 55. The image at the surface of wafer W is transferred to a data processing unit for inspection such as for the aforementioned line width measurement of a pattern. Wafer W is then returned to delivery stage TRS0 in shelf unit U5 via auxiliary arm 51, and further transported to delivery stage TRS-F, for example, by first delivery arm 41. Then, wafer W is transferred by transfer arm C to its former carrier 20 located in carrier block S1. Although the present embodiment was described in which wafer W subjected to inspection is output via delivery stage TRS-F, wafer W may be output through transfer arm C alternatively via a delivery stage for output not shown, located at a height achieving access by transfer arm C, in shelf unit U5.

Inspection may be carried out to all or some of wafers W subjected to development. In the latter case, a predetermined wafer W in the lot is transferred to substrate inspection unit 5, whereas the other wafers W are output using transfer arm C via, for example, delivery sage TRS-F.

Inspection of the thickness of the resist film, for example, may be conducted at substrate inspection unit 5 with respect to wafer W subjected to resist application (, for example, with respect to the monitor wafer or wafer product). In this case, wafer W having a resist film formed at COT layer B4 is transferred to delivery stage TRS0 that is the inspection port via delivery stage TRS4 and first delivery arm 41 to be input into substrate inspection unit 5 for inspection.

The present invention is characterized in that substrate inspection unit 5 is disposed at the empty space located at the upper portion of carrier block S1 and wafer W is transferred via delivery stage TRS0 identified as the inspection port in delivery stage group (shelf unit U5) by means of first delivery arm 41 identified as the vertical transportation unit. The accommodation of substrate inspection unit 5 at an originally empty space at the upper portion of carrier block S1 eliminates the disadvantageous layout of substrate inspection unit 5 protruding sideways from the main unit of the application and development apparatus. An appropriate layout can be realized without disadvantage from the standpoint of installation space.

Since transportation of wafer W with respect to substrate inspection unit 5 is conducted using first delivery arm 41 that effects transportation between application film formation blocks B3-B5 and development process blocks B1 and B2, a transportation mechanism of a large vertical stroke or the need to increase the vertical stroke of transfer arm C reflecting the arrangement of substrate inspection unit 5 located at a high position is eliminated.

The arrangement of substrate inspection unit 5 in carrier block S1 is also advantageous in that an externally applied wafer W can be input via carrier block S1 to receive inspection even when maintenance is conducted at process block S2. Furthermore, wafer W subjected to the development process can be transferred to substrate inspection unit 5 by first delivery arm 41, obviating a complicated transportation route of having to return back through the route in the process block.

Advantages specific to the present invention are set forth below. Blocks B3-B5 each directed to coating film application and blocks B1 and B2 each directed to a development process are located at different areas with a dedicated main arm A provided at each area. Therefore, the load on main arm A can be alleviated. The transportation efficiency of main arm A is improved. As a result, the throughput can be increased.

With regards to the coating film formation blocks, a block dedicated to form a resist film (COT layer B4), a block dedicated to form a first anti-reflective film (BCT layer B5), and a block dedicated to form a second anti-reflective film (TCT layer B3) are provided in a stacked manner. This provides space-saving since the occupying area of process block S2 does not have to be increased for a process of forming an anti-reflective film above and below the resist film than for a process of forming only a resist film.

Figure 8:
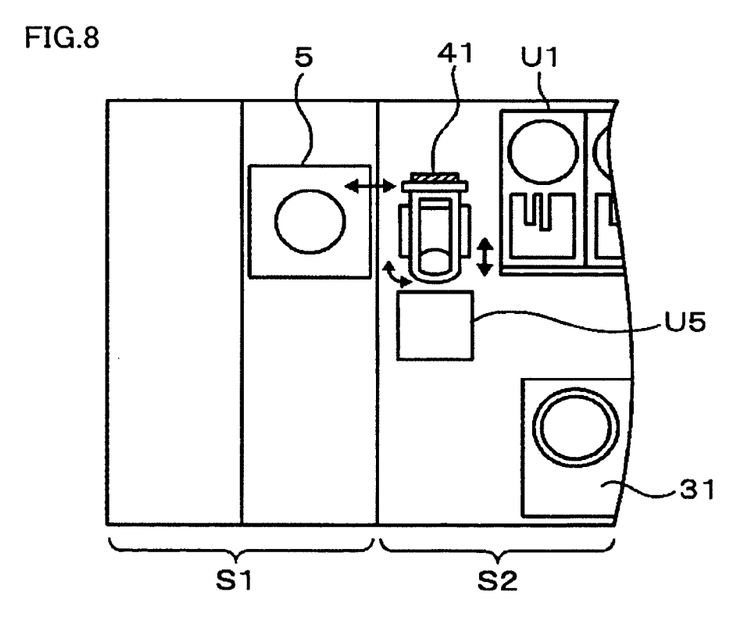
FIG. 8 is a fragmentary plan view of the main part of an application and development apparatus according to another embodiment of the present invention.

FIG. 8 is a partial plan view of another embodiment of the present invention. In the present embodiment, first delivery arm 41 is equipped with a horizontal rotary function. First delivery arm 41 can ascend upon receiving a wafer W subjected to development from delivery stage TRS1, for example, to transfer it to substrate inspection unit 5. FIG. 8 represents a configuration in which wafer W is transferred to a stage (the rotary mount) in substrate inspection unit 5 by first delivery arm 41. As an alternative configuration, an intermediate stage can be provided at the site of substrate inspection unit 5 illustrated in FIG. 8 where wafer W is delivered, and substrate inspection unit 5 is shifted to be located at the lower side in FIG. 8, with an auxiliary arm provided between the intermediate stage and substrate inspection unit 5.

The present embodiment provides advantages similar to those set forth above since substrate inspection unit 5 is disposed at the upper empty space of carrier block S1.

Figure 9:
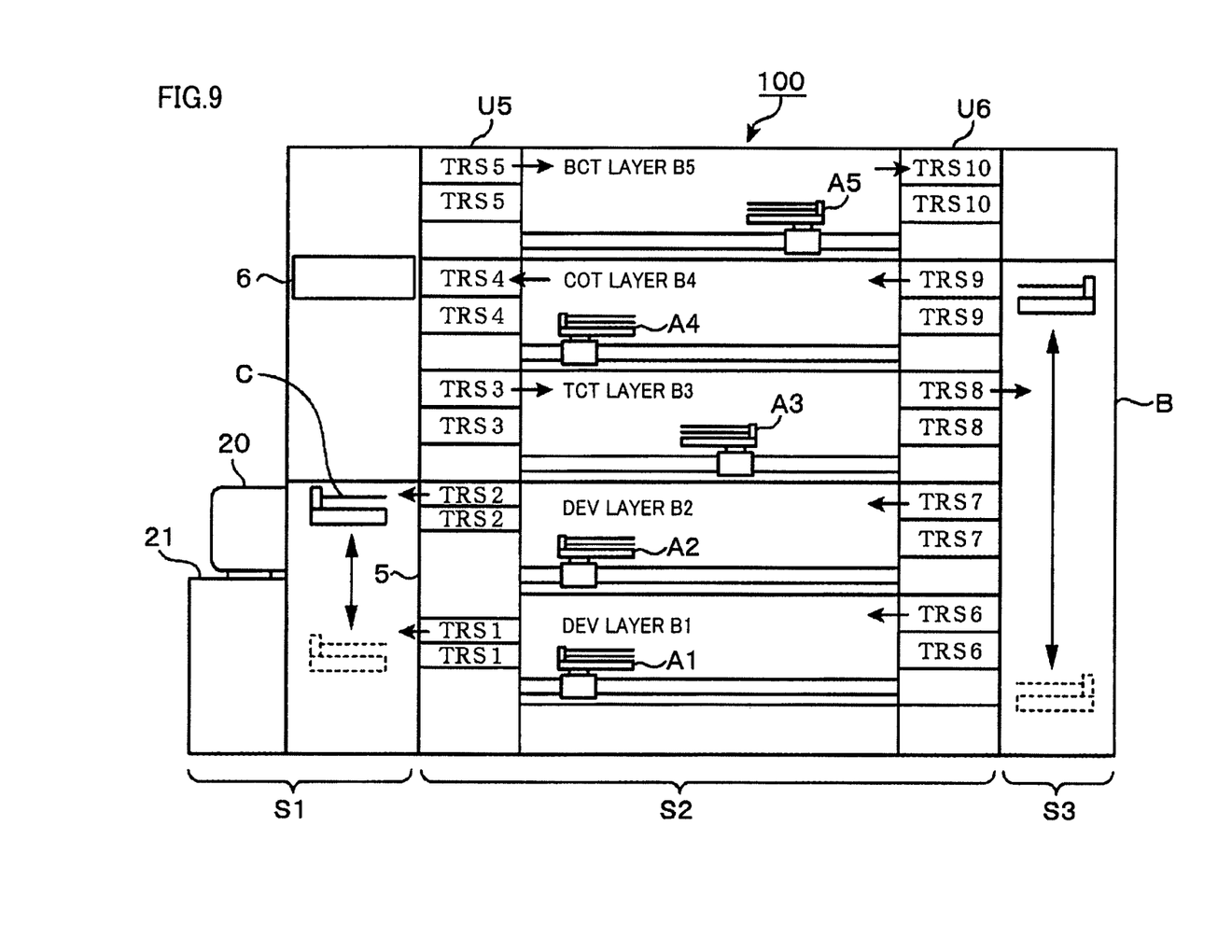
FIG. 9 is a side sectional view of an application and development apparatus according to a further embodiment of the present invention.
Figure 10:
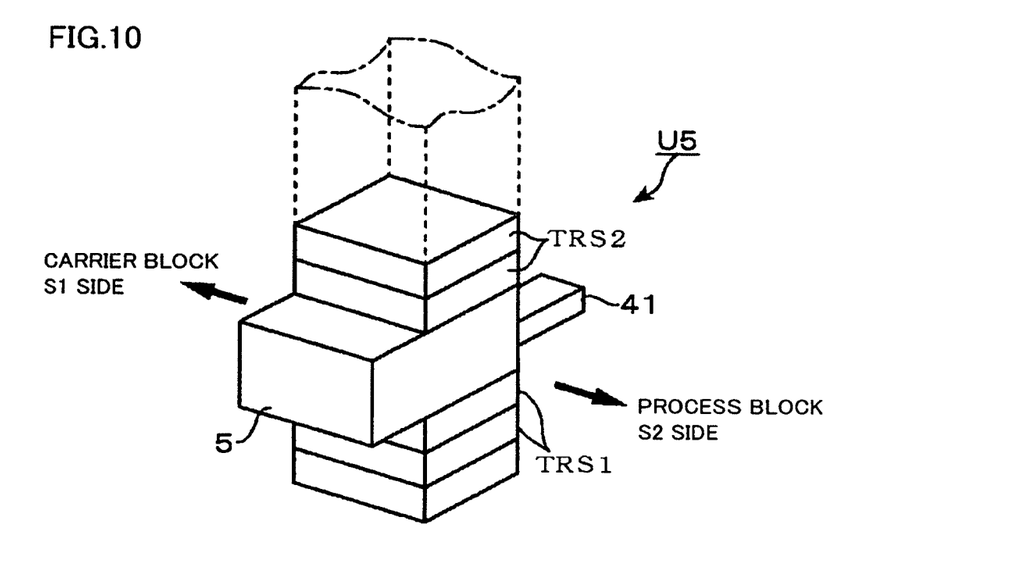
FIG. 10 is a fragmentary perspective view of the main part of the application and development apparatus of FIG. 9.

FIGS. 9 and 10 represent a further embodiment of the present invention. Substrate inspection unit 5 is provided in shelf unit U5 that is the delivery stage group. Although substrate inspection unit 5 is disposed at the height level between DEV layers B1 and B2, the position of substrate inspection unit 5 is not limited thereto. Wafer W subjected to development is input into substrate inspection unit 5 from delivery stage TRS1 or TRS2 via first delivery arm 41. Alternatively, wafer W may be input into substrate inspection unit 5 by a main arm in the process block, identified as the transportation unit for use in a block (for example, main arm A1 (or A2) of DEV layer B1 (or B2)).

It is appreciated that there is an empty space in the height direction in shelf unit U5 formed of a group of delivery stages, based on the difference in height of one of blocks B3, B4, and B5 directed to coating film formation and blocks B1 and B2 directed to a development process from the height of the delivery stage. In the present embodiment, substrate inspection unit 5 is disposed taking advantage of this empty space. Thus, a rational layout can be realized, likewise the previous embodiments, to obviate an unfavorable configuration from the standpoint of installation space.

The empty space in shelf unit U5 can be used as the chemical area including bottles, pipes, and interconnection for the chemical agents used at the solution processing unit.

Figure 11:
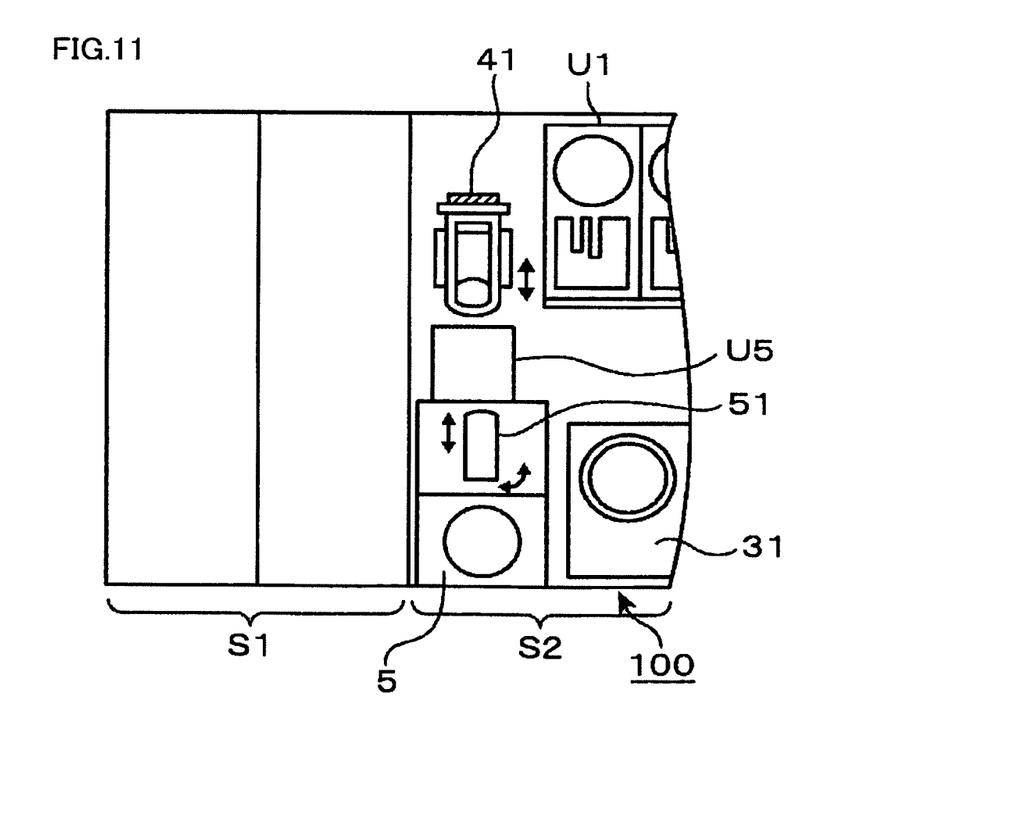
FIG. 11 is a fragmentary plan view of the main part of an application and development apparatus according to still another embodiment of the present invention.

FIG. 11 represents still another embodiment of the present invention. Between carrier block S1 and layered block 100 is provided a substrate inspection unit 5 at the side of the delivery stage group (shelf unit U5) opposite to where delivery arm 41 identified as the vertical transportation unit is located (the right side of shelf unit U5 when viewed from the front of the application and development unit). Also, an auxiliary arm 51 that is horizontally rotatable, and that can move forward and backward and slightly vertically is provided between substrate inspection unit 5 and shelf unit U5. One delivery stage, for example, in shelf unit U5 is set as delivery stage TRS0 identified as the inspection port, and auxiliary arm 51 functions to transport wafer W between stage TRS0 and a stage in substrate inspection unit 5.

The location of substrate inspection unit 5 in height to may be set corresponding to one of the topmost stage, the bottommost stage, or a middle stage in shelf unit U5. Wafer W is input into substrate inspection unit 5 through the route of first delivery arm 41→delivery stage TRS0→auxiliary arm 51→substrate inspection unit 5, and output in an opposite route. Wafer W may be transferred directly between first delivery arm 41 and auxiliary arm 51 in shelf unit U5 without using delivery stage TRS0.

The present embodiment provides advantages similar to those set forth above since substrate inspection unit 5 is arranged taking advantage of the empty space adjacent to the delivery stage group (shelf unit U5).

With regards to the blocks directed to coating film formation, the respective solution processing units to form a lower reflection film, a resist film, and an upper reflection film can be integrated into one stage to which the heating system unit for a pretreatment and post-treatment of the solution process is also incorporated, thus allowing a lower reflection film, resist film, and an upper reflection film to be formed for wafer W by a block of one stage. A configuration with a plurality of stages of such a block (for example 3 stages) may be employed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An application and development apparatus configured to deliver a substrate input to a carrier block by a carrier to a process block via a transportation unit for use in the carrier block, form a coating film including a resist film on said substrate at the process block, transport said substrate from the process block to an exposure apparatus via an interface block that is connected to the process block at a side of the process block that is remote from the carrier block, apply a development process at said process block to said substrate subjected to exposure and returned to said process block via said interface block, and deliver said substrate subjected to development to said carrier block, said application and development apparatus comprising:

a plurality of vertically stacked blocks that are directed to said coating film formation, wherein each of said plurality of blocks directed to said coating film formation comprises a plurality of first processing units including a first solution processing unit to apply a coating solution to said substrate and a first heating unit heating said substrate applied with said coating solution, a first substrate transportation region extending linearly and horizontally from said carrier block toward said interface block, and a first transportation unit for transporting said substrate between the first processing units within said first transportation region, at least one of said blocks directed to said coating film formation including a solution processing unit for resist solution application, said application and development apparatus further comprising a development process block vertically stacked with said blocks directed to said coating film formation to constitute a layered block as said process block, wherein said development process block comprises a plurality of second processing units including a second heating unit to heat said substrate subjected to exposure and a second solution processing unit to apply a developer on said substrate, a second substrate transportation region extending linearly and horizontally from said carrier block toward said interface block, and a second transportation unit for transporting said substrate between the second processing units within said second transportation region, said application and development apparatus further comprising:

a shelf-type delivery stage group including a plurality of delivery stages between said carrier block and said layered block, each of said plurality of delivery stages arranged for each of said plurality of blocks directed to said coating film formation and said development process block to deliver said substrate with respect to said first transportation unit, a vertical transportation unit arranged at one of a left side and right side of said delivery stage group when viewed from said carrier block side, ascending and descending between each of said delivery stages at said delivery stage group to deliver said substrate, and a substrate inspection unit provided at a side of said delivery stage group opposite to the side where said vertical transportation unit is located, said substrate being input into said substrate inspection unit passing through said delivery stage group from said vertical transportation unit.

2. The application and development apparatus according to claim 1, further comprising an auxiliary transportation unit dedicated to said substrate inspection unit, between said delivery stage group and said substrate inspection unit, said substrate placed at said delivery stage in said delivery stage group being input into said substrate inspection unit via said auxiliary transportation unit.

3. The application and development apparatus according to claim 1, wherein said plurality of blocks directed to said coating film formation comprises a block to apply a resist solution to said substrate, a block to apply a chemical solution for an anti-reflective film to said substrate before applying the resist solution, and a block to apply a chemical solution for an anti-reflective film to said substrate after the resist solution is applied.

4. The application and development apparatus according to claim 1, wherein said delivery stage group comprises a delivery stage for the carrier block to transfer said substrate between said carrier block and said process block.

5. The application and development apparatus according to claim 2 wherein said plurality of blocks directed to said coating film formation comprises a block to apply a resist solution to said substrate, a block to apply a chemical solution for an anti reflective film to said substrate before applying the resist solution, and a block to apply a chemical solution for an anti-reflective film to said substrate after the resist solution is applied.

6. The application and development apparatus according to claim 2, wherein said delivery stage group comprises a delivery stage for the carrier block to transfer said substrate between said carrier block and said process block.

* * * * *